United States Patent [19]

Takenaka et al.

[11] Patent Number: 4,885,229

[45] Date of Patent: Dec. 5, 1989

[54] PHOTOPOLYMERIZABLE COMPOSITIONS

[75] Inventors: Fumio Takenaka; Kouzi Tohya; Yoshihiro Ohtsuka, all of Amagasaki, Japan

[73] Assignee: 501 Daicel Chemical Industries Ltd., Osaka, Japan

[21] Appl. No.: 136,709

[22] Filed: Dec. 22, 1987

[51] Int. Cl.$^4$ .............................................. G03C 1/68
[52] U.S. Cl. .................................... 430/285; 430/288; 430/286; 430/910; 522/121; 522/39; 522/46
[58] Field of Search ............... 430/910, 285, 288, 286; 522/121, 39, 46

[56] References Cited

U.S. PATENT DOCUMENTS

| | | | |
|---|---|---|---|
| 3,245,793 | 4/1966 | Smith | 430/281 |
| 3,380,831 | 4/1968 | Cohen et al. | 430/288 |
| 4,180,474 | 12/1979 | Schuster et al. | 430/288 |
| 4,562,142 | 12/1985 | Kakumara et al. | 430/288 |

FOREIGN PATENT DOCUMENTS 153308  7/1987  Japan .

*Primary Examiner*—Paul R. Michl
*Assistant Examiner*—Cynthia Hamilton
*Attorney, Agent, or Firm*—Bryan, Cave, McPheeters & McRoberts

[57] ABSTRACT

A photosensitive hardenable composition comprising as major components a thermoplastic high molecular binder obtained from specific addition polymerizable monomers, an acrylate (or methacryliate) derivative or mixture thereof and a photopolymerization initiator, which possesses improved properties in softness, stripping properties, stripping time, etc. of hardened layers formed.

11 Claims, No Drawings

PHOTOPOLYMERIZABLE COMPOSITIONS

BACKGROUND OF THE INVENTION

1. Field of the Invention

The present invention relates to photosensitive hardenable compositions which are hardened upon exposure to light and developable with alkaline aqueous solutions. More particularly, the present invention relates to photopolymerizable hardenable compositions showing improved properties in softness, stripping properties, stripping time, etc. of hardened layers formed.

2. Description of the Related Art

In general, photopolymerizable hardenable compositions are laminated in base plates (for example, a copper-clad laminate), metal surfaces suitable for minute finishing, etc., by conventional coating or lamination methods. Upon exposure to actinic light, exposed areas are hardened and unexposed areas are dissolved and removed with solvents having a suitable solubility. The solvents are roughly classified into organic solvents such as 1,1,1-trichloroethane and aqueous solvents such as sodium carbonate aqueous solution.

In recent years, photopolymerizable hardenable compositions which are developed using aqueous solvents have been increasingly used in view of operational environments, natural environments and production costs.

However, photopolymerizable hardenable compositions of aqueous solvent development type involve many restrictions in etching or a plating treatment as compared to the case of using conventional photopolymerizable hardenable compositions of organic solvent development type and, often cause problems upon use. Particularly in the case of using alkaline treating solutions, acidic thermoplastic high molecular binders are fundamentally used so that the use is greatly restricted.

In addition, hardened layers after pattern formation through etching or plating are rigid and fragile and thus often scraped off base plates, as compared to the case of using conventional photopolymerizable hardenable compositions of organic solvent development type.

Further, a long period of time is required for stripping hardened layers. Furthermore, stripped layers do not go into pieces but become so called "seaweed"-like so that a problem of causing readhesion and difficulties in reproduction by filtration of stripping solutions become serious problems in operations.

The present inventors have previously proposed a photopolymerizable hardenable composition comprising specific thermoplastic high molecular binders as described below wherein trimethylolpropane triacrylate as an addition polymerizable compound is used in combination with a photopolymerizable initiator (Published Unexamined Japanese patent application No. 153308/87). However, this photopolymerizable hardenable composition has defects that a stripping time is long and hardened layers lack softness. Therefore, the present inventors have made further investigations and as a result, found that by incorporating specific addition polymerizable compounds therein, excellent photopolymerizable hardenable compositions can be obtained.

SUMMARY OF THE INVENTION

According to the present invention, there are provided photopolymerizable hardenable compositions comprising as major components:

(1) a thermoplastic high molecular binder obtained by copolymerizing:

(i) 4 to 40 wt % of an additional polymerizable monomer (A) containing a carboxyl group;

(ii) At least 5 wt. % of at least one additional polymerizable nonacidic monomer (B) represented by the general formula:

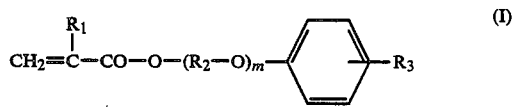

wherein $R_1$ is a hydrogen atom or methyl group; $R_2$ is an alkylene group having 1 to 5 carbon atoms; $R_3$ is a hydrogen atom, a halogen atom or an alkyl group having 1 to 5 carbon atoms; and m is an integer of 1 to 20; and (iii) at least one addition polymerizable non-acidic monomer (C) satisfying the following formula:

$$0.25 < \frac{Q_A}{Q_C} \text{Exp}\,[-e_A\,(e_A - e_C)] < 4.00 \qquad (II)$$

wherein Q and e are stability and polar value defined by the Alfrey-Price equation; symbol and the symbols A and C correspond to the addition polymerizable monomer (A) and the addition polymerizable non-acidic monomer (C) respectively;

(2) at least one acrylate or methacrylate ester derivative selected from the compounds of formulae (III), (IV) and (V); or a mixture of two or more ester derivatives selected from the compounds of formulae III, IV and V formulae;

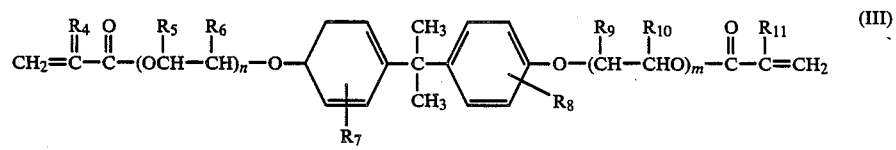

wherein $R_4$, $R_5$, $R_6$, $R_9$, $R_{10}$ and $R_{11}$ are the same or different, and each is a hydrogen atom or methyl group; $R_7$ and $R_8$ are the same or different, and each is a hydrogen atom or a halogen atom; and n and p are each positive integers satisfying n+p=2 to 20;

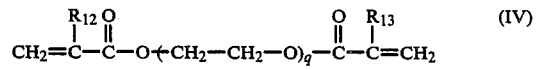

$R_{12}$ and $R_{13}$ are the same or different, and each is a hydrogen atom or a methyl group; and q is an integer of 4 to 13;

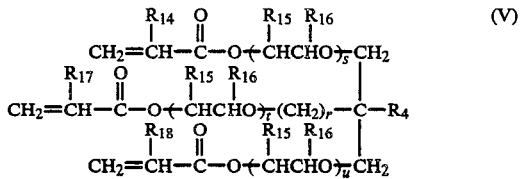

wherein $R_{14}$ is a hydrogen atom, an alkyl group having 1 to 6 carbon atoms, or an aryl group; $R_{15}$ and $R_{16}$ are each a hydrogen atom or a methyl group, provided that at least one is a methyl group; $R_{17}$ and $R_{18}$ are the same or different, and each is a hydrogen atom or methyl group; r is 0, 1, 2 or 3; and s, t and u are each a positive integer satisfying s+t+u are an integer satisfying l+m+n=3 to 30; and (3) a photopolymerization initiator.

DESCRIPTION OF THE PREFERRED EMBODIMENTS

Firstly, the thermoplastic high molecular binder which can be used in the present invention will be described in detail.

In the photosensitive hardenable composition of addition polymerizable compound type in accordance with the present invention, resistance of a resist coating greatly depends on properties of the high molecular binder. The addition polymerizable acidic monomer (A) containing carboxyl groups in the copolymer for forming the high molecular binder of the present invention imparts developing property to the copolymer. A proportion of (A) in the copolymer composition is an a range of 4 to 40 wt %. A suitable proportion varies depending upon kind of developer; in a so called semi-aqueous solution development type in which, for example, ethylene glycol monobutyl ether is incorporated, the proportion is in a range of 4 to 15 wt % and in a fully aqueous solution development type, the proportion is in a range of 15 to 40 wt %, as a measure. Of course, the optimum copolymerization rate of the addition polymerizable acidic monomer of either the semi-aqueous solution development type or the fully aqueous solution development type varies depending upon developer and developing conditions. In the present invention, methacrylic acid and a mixture of methacrylic acid and acrylic acid are preferred as the addition polymerizable monomer (A) containing carboxyl groups.

The thermoplastic high molecular binder is basically swollen and dissolved in an alkaline solution because such addition polymerizable acidic monomers are copolymerized. In order to impart resistance, therefore, it is essential to copolymerize the addition polymerizable non-acidic monomer. As those for improving resistance particularly to an alkaline aqueous solution, the addition polymerizable non-acidic monomers (B) which are acrylates or methacrylates are effective.

Examples of such monomers are 2-phenoxyethyl acrylate, 2-phenoxyethyl methacrylate, 2-phenoxypropyl acrylate, 3-phenoxypropyl acrylate, phenoxydiethoxy acrylate, phenoxytriethoxy acrylate, phenoxydipropoxy acrylate, p-chlorophenoxyethyl acrylate, p-methylpnenoxyethyl acrylate, 2-phenoxypropyl methacrylate, 3-phenoxypropyl methacrylate, phenoxydiethoxy methacrylate, phenoxytriethoxy methacrylate, phenoxydipropoxy methacrylate, p-chlorophenoxyethyl methacrylate, p-methylphenoxyethyl methacrylate, etc. These addition polymerizable non-acidic monomers (B) must be contained in an amount of at least 5 wt % or more in the copolymer, preferably in an amount of 10 to 70 wt %.

The addition polymerizable non-acidic monomer (C) is a component which imparts resistance together with the addition polymerizable monomer (B). In addition thereto, the monomer (C) has a role of controlling a glass transition point (Tg) of the copolymer. A preferred Tg of the copolymer is between 40° and 120° C. When Tg is lower than 40° C., a "cold flow" phenomenon that a photosensitive layer flows out with passage of time occurs in case that the photosensitive layer is used as a "dry film" in which the photosensitive layer is sandwiched between a support film and a protective film. Further when Tg is higher than 120° C., adhesiveness of the photosensitive layer to the support is seriously injured.

In addition, the addition polymerizable non-acidic monomer (C) has an action to copolymerize intramolecularly and intermolecularly with the addition polymerizable acidic monomer (A) as uniformly as possible. Unless the addition polymerizable acidic monomer is not polymerized uniformly, not only poor development of the hardenable composition is caused but also precipitation of the copolymer upon polymerization and at formulation of a coating solution occurs in an extreme case. Such addition polymerizable non-acidic monomer (C) is determined depending upon the addition polymerizable acidic monomer (A). In case that, for example, methacrylic acid ($Q_A=2.340$, $e_A=0.650$) is selected as the polymerizable monomer (A), mention may be made of methyl methacrylate ($Q_C=0.740$, $e_C=0.400$, $Q_A/Q_C \exp\{-e_A(e_A-e_C)\}=2.69$), ethyl methacrylate ($Q_C=0.730$, $e_C=0.520$, $Q_A/Q_C \exp\{-e_A(e_A-e_C)\}=2.95$, etc. In this case, when n-butyl acrylate ($Q_C=0.500$, $e_C=1.060$, $Q_A/Q_C \exp\{-e_A(e_A-e_C)\}=6.11$) is used, methacrylic acid is rapidly consumed during polymerization so that a non-uniform polymerization composition results and precipitates occur in some occasion.

In case that a plurality of the addition polymerizable moonmers (A) are employed in the present invention, the addition polymerizable non-acidic monomer (C) should satisfy the equation (II) described above between (C) and at least one of the addition polymerizable acidic monomer (A).

Further the addition polymerizable non-acidic monomer (C) constitutes the balance of the monomers (A) and (B) used in the thermoplastic high molecular binder to make 100%.

In the composition of the present invention, acrylate (or methacrylate) derivatives of components (2) are formulated in the thermoplastic high molecular binder of component (1).

The components (2) all fall within acrylate (or methacrylate) derivatives and can be represented by general formulae (III) through (V).

As the addition polymerizable compounds represented by general formula (III), mention may be made of 2,2-bis[4-(acryloxydiethoxy)phenyl]propane, 2,2-bis[4-(acryloxypentaethoxy)phenyl]propane, 2,2-bis[4-(methacryloxydiethoxy)phenyl]propane, 2,2-bis[4-(methacryloxypentaethoxy)phenyl]propane, 2,2-bis[4-(acryloxydipropoxy)phenyl]propane, 2,2-bis[4-(acryloxypentapropoxy)phenyl]propane, 2,2-bis[4-(methacryloxydipropoxy)phenyl]-propane, 2,2-bis[4-(methacryloxypentapropoxy)phenyl]propane, etc.

As the addition poylmerizable compounds represented by general formula (IV), mention may be made of tetraethylene glycol diacrylate, pentaethylene glycol diacrylate, hexaethylene glycol diacrylate, heptaethylene glycol diacrylate, octaethylene glycol diacrylate, nonaethylene glycol diacrylate, decaethylene glycol diacrylate, undecaethylene glycol diacrylate, dodecaethylene glycol diacrylate, tridecaethylene glycol diacrylate, tetraethylene glycol dimethacrylate, hexaethylene glycol dimethacrylate, octaethylene glycol dimethacrylate, nonaethylene glycol dimethacrylate, decaethylene glycol dimethacrylate, dodecaethylene glycol dimethacrylate, tridecaethylene glycol dimethacrylate, etc.

As the addition polymerizable compounds represented by general formula (V), mention may be made of glycerylpropoxy triacrylate, glycerylpropoxy trimethacrylate, glyceryldipropoxy triacrylate, glyceryltripropoxy trimethacrylate, trimethylolpropanepropoxy acrylate, trimethylolpropanetetrapropoxy acrylate, trimethylolpropoxytetrapropoxy trimethacrylate, trimethylolhexapropoxy trimethacrylate, etc.

It has been found that the addition polymerizable compound of general formula (III) is effective for shortening stripping time of layers formed by the composition of the present invention.

It has further been found that the addition polymerizable compound of general formula (IV) is effective for imparting softness to the formed layers.

It has further been found that the addition polymerizable compound of general formula (V) has an effect of stripping the formed layers into small pieces.

Accordingly, the acrylate (or methacrylate) derivatives used in the composition of the present invention can be chosen and utilized depending upon the desired effect.

However, preferred examples of the combination are (III)+(IV)+(V), (III)+(IV), (III)+(V) and (IV)+(V). Of these, particularly preferred combination is (III)+(IV). The compounds falling under the respective general formulae can be used singly, needless to say, but may also be used as admixture of two or more. In the combinations described above, a ratio is, for example, 1:1 to 0.1:1 to 0.1 (part by weight) and 1:1 to 0.1 (part by weight) in the 3 component system and the 2 component system. In particular, a preferred ratio in the combination of (III)+(IV) is 1:0.3 to 0.1 (part by weight).

The acrylate (or methacrylate) derivatives (III) through (V) of components (2) are used in an amount of 10 to 200 parts by weight, preferably 40 to 80 parts by weight, based on 100 parts by weight of the thermoplastic high molecular binder of component (1).

If necessary and desired, other acrylates such as trimethylolpropane triacrylate may also be incorporated to accelerate hardening.

As the photopolymerization initiator which can be used in the composition of the present invention, there are the following ones.

Namely, there are substituted or unsubstituted polynuclear quinones which are exemplified by 2-ethylanthraquinone, 2-tertbutylanthraquinone, octamethylanthraquinone, 1,2-benzanthraquinone, 1,3-benzanthraquinone, 2-phenylanthraquinone, 2,3-diphenylanthraquinone, 1-chloroanthraquinone, 2-chloroanthraquinone, 2-methylanthraquinone, 1,4-naphthoquinone, 9,10-phenanthraquinone, 2-methyl-1,4-naphthoquinone, 2,3-dichloronaphthoquinone, 1,4-dimethylanthraquinone, 2,3-dimethylanthraquinone, 3-chloro-2-methylanthraquinone, 7,8,9,10-tetrahydrophthacenequinone, etc. In addition, there are aromatic ketones, for example, benzophenone, Michler's ketone [i.e., 4,4'- bis-dimethylamono-benzophenone, 4,4'-bis-diethylaminobenzophenone, 4'methoxy-4'-dimethylaminobenzophenone, etc.]. There are further benzoins and benzoin ehters which are exemplified by benzoin methyl ether, benzoin ethyl ether, benzoin phenyl ether, methylbenzoin, ethylbenzoin, etc. In addition, there may also be used combination of 2,4,5triarylimidazole dimers with 2-mercaptobenzoxazole, leuco crystal violet, tris(4-diethylamino-2-methylphenyl)methane, etc.

In addition, there are substituted or unsubstituted thioxanthones, for example, 2-chlorothioxanthone, 2,4-diethylthioxanthone, 2,4-dimethylthioxanthone, etc. Furthermore, these thioxanthones may also be used in combination with aliphatic or aromatic tertiary amines, for example, N-methyldiethanolamine, ethyl p-dimethylaminobenzoate, etc. In addition, the combination of thioxanthones with alkylaminobenzophenones (for example, Michler's ketone) and the combination of thioxanthones with oxime esters (for example, benzophenone oxime acetate) are also effective. These addition polymerization initiators which can be activated by light can be used singly or as admixture of two or more. The present invention is not limited thereto.

These initiators can be used in an amount of 0.01 to 30 parts by weight, preferably 0.1 to 15 parts by weight, based on 100 parts by weight of the thermoplastic high molecular binder of component (1).

In the present invention, a stabilizer, a dyestuff, etc. may be added in addition to the foregoing essential compounds, if necessary or desired. As the stabilizer, mention may be made of, for example, hydroquinone, hydroquinone monomethyl ether, t-butylcatechol, etc. These stabilizers can be added in such a range that does not inhibit photopolymerization. Further in order to impart a suitable softness, a plasticizer may also be added and mention may be made of, for example, phthalic acid esters such as diethyl phthalate, dibutyl phthalate, diheptyl phthalate, dioctyl phthalate, etc.; fatty acid esters such as dioctyl adipate, dibutyldiglycol adipate, etc.; phosphoric acid esters such as trimethyl phosphate, etc.; sulfonic amides such as toluenesulfonic amide, etc.

In order to make visual distinction of photosensitive layers easy, dyes may further be added and mention may be made of, for example, crystal violet, malachite green, victoria blue, methylene blue, etc.

The photopolymerizable hardenable composition of the present invention can be provided for a photopolymerizable layer by applying the conventional printing method or coating method, without adding any particular solvent thereto. In general, however, the composition is dissolved or dispersed in organic solvents such as methyl ethyl ketone, tetrahydrofuran, etc. The solution or dispersion is applied to a suitable support and then the solvent is evaporated off to prepare a photopolymerizable layer, Particularly in the case of using a "dry film", for example, a polyester film is used as a support film and a photopolymerizable layer is formed thereon using the photopolymerizable hardenable composition of the present invention and, this layer is covered with a polyolefin film layer to make the dry film.

According to the present invention, photohardenable layers in which stripped layers go into small pieces as compared to conventional layers are obtained. The detail will be described in the examples below.

Such photopolymerizable layers are hardened by appropriate light sources, for example, light from a low pressure mercury lamp, a super high pressure mercury lamp, etc. The composition of the present invention can be used as a photopolymer or photo resist in preparing metal relief images, print wire base plates, etc.

Next, the present invention will be described in more detail with reference to the examples below.

EXAMPLE 1

The following components were mixed to give a photosensitive polymerizable composition.

| | |
|---|---|
| Copolymer of 12 wt % of methacrylic acid, 8 wt % of acrylic acid, 35 wt % of 2-phenoxyethyl acrylate and 45 wt % of methyl methacrylate | 50 g |
| Nonaethylene glycol diacrylate | 2.5 g |
| 2,2-Bis[4-(acryloxydiethoxy)phenyl]propane | 7.5 g |
| 2,2-Bis[4-(methacryloxypentaethoxy)phenyl]propane | 10 g |
| Trimethylolpropane triacrylate | 5 g |
| Diethylthioxanthone | 1 g |
| N—Methyldiethanolamine | 0.1 g |
| Victoria blue | 0.05 g |
| Methyl ethyl ketone | 70 g |
| Tetrahydrofuran | 10 g |

This composition was coated onto a polyethylene glycol terephthalate film support having a thickness of 25 μm and dried at 75° C. to give a photosensitive film. A thickness of the photosensitive layer was 50 μm. The film was laminated onto a copper-clad laminate which had been polished, by means of rubber rollers heated to 100° C. A wire circuit pattern mask was put thereon and exposure was performed for 10 seconds from a distance of 50 cm using a super high pressure mercury lamp of 2 kw to harden. Thereafter development was performed with a 1% sodium carbonate aqueous solution of 30° C. to give resin relief images on the copper-clad laminate. The hardened layer retained softness.

Next, copper was etched with an alkali etchant to give a good printed wiring board.

Then, the system was immersed at 50° C. in 3% sodium hydroxide aqueous solution to strip the hardened layer. Strip was completed in about one minute.

EXAMPLE 2

The following components were mixed to give a photosensitive polymerizable composition.

| | |
|---|---|
| Copolymer of 12 wt % of methacrylic acid, 8 wt % of acrylic acid, 35 wt % of 2-phenoxyethyl acrylate and 45 wt % of methyl methacrylate | 50 g |
| Nonaethylene glycol diacrylate | 1.6 g |
| 2,2-Bis 4-(acryloxydiethoxy)phenyl propane | 4.8 g |
| 2,2-Bis 4-methacryloxypentaethoxy)phenyl propane | 6.4 g |
| Trimethylolpropane triacrylate | 3.2 g |
| Diethylthioxanthone | 1 g |
| N—Methyldiethanolamine | 0.1 g |
| Victoria blue | 0.05 g |
| Methyl ethyl ketone | 70 g |
| Tetrahydrofuran | 10 g |

This composition described above was evaluated in a manner similar to Example 1. Almost similar results were obtained.

EXAMPLE 3

The following components were mixed to give a photosensitive polymerizable composition.

| | |
|---|---|
| Copolymer of 12 wt % of methacrylic acid, 8 wt % of acrylic acid, 35 wt % of 2-phenoxyethyl acrylate and 45 wt % of methyl methacrylate | 50 g |
| Nonaethylene glycol diacrylate | 7 g |
| 2,2-Bis [4-(acryloxydiethoxy)phenyl]propane | 21 g |
| 2,2-Bis [4-(methacryloxpentaethoxy)phenyl]propane | 28 g |
| Trimethylolpropane triacrylate | 14 g |
| Diethylthioxanthone | 1 g |
| N—Methyldiethanolamine | 0.1 g |
| Victoria blue | 0.05 g |
| Methyl ethyl ketone | 70 g |
| Tetrahydrofuran | 10 g |

This composition described above was evaluated in a manner similar to Example 1. Almost similar results were obtained

EXAMPLE 4

A photosensitive polymerizable composition was obtained in a manner similar to Example 1 except that only the copolymer in the composition of Example 1 was replaced with copolymers described below.

| | |
|---|---|
| Copolymer of 25 wt % of methacrylic acid, 45 wt % of 2-phenoxyethyl acrylate and 45 wt % of methyl methacrylate | 50 g |
| Copolymer of 20 wt % of methacrylic acid, 35 wt % of 2-phenoxyethyl acrylate and 45 wt % of ethyl methacrylate | 50 g |
| Copolymer of 12 wt % of methacrylic acid, 8 wt % of acrylic acid, 20 wt % of 2-phenoxyethyl acrylate and 60 wt % of propyl methacrylate | 50 g |

This composition was evaluated in a manner similar to Example 1. Each of the 3 kinds of compositions showed a sufficient etching resistance, showed a short stripping time and gave a soft hardened layer.

EXAMPLE 5

Copolymers having the composition of the copolymer of Example 1 except that the ratios were changed as shown below were prepared. The copolymers were formulated and evaluated in a manner similar to Example 1. Likewise, a sufficient etching resistance was noted and, softness and stripping properties were good.

| Copolymer of (1) wt % of methacrylic acid, (2) wt % of acrylic acid, (3) wt % of 2-phenoxyethyl acrylate and (4) wt % of methyl methacrylate | | | |
|---|---|---|---|
| (1) | (2) | (3) | (4) |
| Ex. 5-1 | 3 | 2 | 5 | 90 |
| Ex. 5-2 | 3 | 2 | 90 | 5 |
| Ex. 5-3 | 22 | 16 | 60 | 2 |

EXAMPLE 6

A composition obtained by mixing the following components was made a photosensitive film in a manner similar to Example 1. This film showed good etching resistance and softness and provided a short stripping time. A shape was shortened to 5 mm square after the stripping.

| | |
|---|---|
| Copolymer of 12 wt % of methacrylic acid, 8 wt % of acrylic acid, 35 wt % of 2-phenoxyethyl acrylate and 45 wt % of methyl methacrylate | 50 g |
| Nonaethylene glycol diacrylate | 2.5 g |
| 2,2-Bis[4-(acryloxydiethoxy)phenyl]propane | 12.5 g |
| Trimethylolpropanepropoxy triacrylate | 5 g |
| Trimethylolpropane triacrylate | 5 g |
| Diethylthioxanthone | 1 g |
| N—Methyldiethanolamine | 0.1 g |
| Victoria blue | 0.05 g |
| Methyl ethyl ketone | 70 g |
| Tetrahydrofuran | 10 g |

EXAMPLE 7

The following components were mixed to give a photosensitive polymerizable composition.

| | |
|---|---|
| Copolymer of 12 wt % of methacrylic acid, 8 wt % of acrylic acid, 45 wt % of methyl methacrylate and 35 wt % of 2-phenoxyethyl acrylate | 50 g |
| 2,2-Bis[4-(acrylox diethoxy)phenyl]propane | 30 g |
| 2-Chlorothioxanthone | 1 g |
| N—Methyldiethanolamine | 0.1 g |
| Victoria blue | 0.05 g |
| Methyl ethyl ketone | 70 g |
| Tetrahydrofuran | 10 g |

This composition was coated onto a polyethylene glycol terephthalate film support having a thickness of 25 μm and dried at 75° C. to give a photosensitive film. A thickness of the photosensitive layer was 50 μm. The film was laminated onto a copper-clad laminate which had been polished, by means of rubber rollers heated at 100° C. A wire circuit pattern mask was put thereon and exposure was performed for 10 seconds from a distance of 50 cm using a super high pressure mercury lamp of 2 kw to harden Thereafter development was performed with a 1% sodium carbonate aqueous solution of 30° C. to give resin relief image on the copper-clad laminate.

Next, copper was etched with an alkali etchant to give a good printed wiring board.

Then, the system was immersed at 50° C. in 3% sodium hydroxide aqueous solution to strip the hardened layer. Stripping was completed in about one minute and 30 seconds.

EXAMPLE 8

The following components were mixed to give a photosensitive polymerizable composition.

| | |
|---|---|
| Copolymer of 12 wt % of methacrylic acid, 8 wt % of acrylic acid, 45 wt % of 2-phenoxyethyl acrylate | 50 g |
| Trimethylolpropane Triacrylate | 15 g |
| 2,2-Bis [4-(acryloxydiethoxy)phenyl]propane | 15 g |
| 2-Chlorothioxanthone | 1 g |
| N—Methyldiethanolamine | 0.1 g |
| Victoria blue | 0.05 g |
| Methyl ethyl ketone | 70 g |
| Tetrahydrofuran | 10 g |

This composition was coated onto a polyethylene glycol terephthalate film support having a thickness of 25 μm and dried at 75° C. to give a photosensitive film. A thickness of the photosensitive layer was 50 μm. The film was laminated onto a copper-clad laminate which had been polished, by means of rubber rollers heated at 100° C. A wire circuit pattern mask was put thereon and exposure was performed for 10 seconds from a distance of 50 cm using a super high pressure mercury lamp of 2 kw to harden. Thereafter development was performed with 1% sodium carbonate aqueous solution of 30° C. to give resin relief images on the copper-clad laminate.

Next, copper was etched with an alkali etchant to give a good printed wiring board.

Then, the system was immersed at 50° C. in 3% sodium hydroxide aqueous solution to strip the hardened layer. Stripping was completed in about 2 minutes.

EXAMPLE 9

The following components were mixed to give a photosensitive polymerizable composition.

| | |
|---|---|
| Copolymer of 10 wt % of methacrylic acid, 10 wt % of acrylic acid, 50 wt % of methyl methacrylate and 30 wt % of 2-phenoxyethyl acrylate | 50 g |
| Trimethylolpropane triacrylate | 15 g |
| 2,2-Bis [4-(methacryloxypentacthoxy)phenyl]propane | 15 g |
| Benzophenone | 1.5 g |
| Michler's ketone | 0.15 g |
| Victoria blue | 0.05 g |
| Methyl ethyl ketone | 70 g |
| Tetrahydrofuran | 10 g |

This composition was evaluated in a manner similar to Example 7. A good printed wiring board was obtained and the hardened layer was completely stripped in about 2 minutes.

EXAMPLE 10

The following components were mixed to give a photosensitive polymerizable composition.

| | |
|---|---|
| Copolymer of 12 wt % of methacrylic acid, 8 wt % of acrylic acid, 45 wt % of methyl methacrylate and 35 wt % of 2-phenoxyethyl acrylate | 50 g |
| Nonaethylene glycol diacrylate | 30 g |
| 2-Chlorothioxanthone | 1 g |
| N—Methyldiethanolamine | 0.1 g |
| Victoria blue | 0.05 g |
| Methyl ethyl ketone | 70 g |
| Tetrahydrofuran | 10 g |

This composition was coated onto a polyethylene glycol terephthalate film support having a thickness of 25 μm and dried at 75° C. to give a photosensitive film. A thickness of the photosensitive layer was 50 μm. The film was laminated onto a copper-clad laminate which had been polished, by means of rubber rollers heated at 100° C. A wire circuit pattern mask was put thereon and exposure was performed for 10 seconds from a distance of 50 cm using a super high pressure mercury lamp of 2 kw to harden. Thereafter development was performed with a 1% sodium carbonate aqueous solution of 30° C. to give resin relief images on the copper-clad laminate.

Next, copper was etched with an alkali ethcant to give a good printed wiring board.

Then exposure was performed likewise except for putting a pattern mask thereon to harden. Thereafter, linear scratches were drawn on the layer by 1 mm intervals with a cutter knife but the hardened layer was not stripped from the copper-clad laminate.

EXAMPLE 11

The following components were mixed to give a photosensitive polymerizable composition.

| | |
|---|---|
| Copolymer of 12 wt % of methacrylic acid, 8 wt % of acrylic acid, 45 wt % of methyl methacrylate and 35 wt % of 2-phenoxyethyl acrylate | 50 g |
| Trimethylolpropane triacrylate | 20 g |
| Nonaethylene glycol diacrylate | 10 g |
| 2-Chlorothioxanthone | 1 g |
| N—Methyldiethanolamine | 0.1 g |
| Victoria blue | 0.05 g |
| Methyl ethyl ketone | 70 g |
| Tetrahydrofuran | 10 g |

This composition was coated onto a polyethylene glycol terephthalate film support having a thickness of 25 μm and dried at 75° C. to give a photosensitive film. A thickness of the photosensitive layer was 50 μm. The film was laminated onto a copper-clad laminate which had been polished, by means of rubber rollers heated 100° C. A wire circuit pattern mask was put thereon and exposure was performed for 10 seconds from a distance of 50 cm using a super high pressure mercury lamp of 2 kw to harden. Thereafter development was performed with a 1% sodium carbonate aqueous solution of 30° C. to give resin relief images on the copper-clad laminate.

Next, copper was etched with an alkali etchant to give a good printed wiring board.

Then, exposure was performed likewise except for putting a pattern mask thereon to harden. Thereafter, linear scratches were drawn on the layer by 1 mm intervals with a cutter knife but the hardened layer was not stripped from the copper-clad laminate.

EXAMPLE 12

The following components were mixed to give a photosensitive polymerizable composition.

| | |
|---|---|
| Copolymer of 10 wt % of methacrylic acid, 10 wt % of acrylic acid, 50 wt % of methyl methacrylate and 30 wt % of 2-phenoxyethyl acrylate | 50 g |
| Trimethylolpropane triacrylate | 10 g |
| 2,2-Bis [4-(acryloxydiethoxy)phenyl]propane | 10 g |
| Nonaethylene glycol dimethacrylate | 10 g |
| 2-Chlorothioxanthone | 1 g |
| N—Methyldiethanolamine | 0.1 g |
| Victoria blue | 0.05 g |
| Methyl ethyl ketone | 70 g |
| Tetrahydrofuran | 10 g |

This composition was evaluated in a manner similar to Example 10. A good printed wiring board was obtained. Even with linear scratches of 1 mm intervals with a cutter knife, the hardened layer was not stripped.

EXAMPLE 13

The following components were mixed to give a photosensitive polymerizable composition.

| | |
|---|---|
| Copolymer of 12 wt % of methacrylic acid, 8 wt % of acrylic acid, 45 wt % of methyl methacrylate and 35 wt % of 2-phenoxyethyl acrylate | 50 g |
| Trimethylolpropanepropoxy triacrylate | 30 g |
| 2-Chlorothioxanthone | 1 g |
| N—Methyldiethanolaine | 0.1 g |
| Victoria blue | 0.05 g |
| Methyl ethyl ketone | 70 g |
| Tetrahydrofuran | 10 g |

This composition was coated onto a polyethylene glycol terephthalate film support having a thickness of 25 μm and dried at 75° C. to give a photosensitive film. A thickness of the photosensitive layer was 50 μm. The film was laminated onto a copper-clad laminate which had been polished, by means of rubber rollers heated at 100° C. A wire circuit pattern mask was put thereon and exposure was performed for 10 seconds from a distance of 50 cm using a super high pressure mercury lamp of 2 kw to harden. Thereafter development was performed with 1% sodium carbonate aqueous solution of 30° C. to give resin relief on the copper-clad laminate.

Next, copper was etched with an alkali etchant to give a good printed wiring board.

Then, the system was immersed at 50° C. in 3% sodium hydroxide aqueous solution to strip the hardened layer. The hardened layer was stripped while the layer went into small pieces of approximately 2 to 5 mm square.

EXAMPLE 14

The following components were mixed to give a photosensitive polymerizable composition.

| | |
|---|---|
| Copolymer of 12 wt % of methacrylic acid, 8 wt % of acrylic acid, 45 wt % of methyl methacrylate and 35 wt % of 2-phenoxyethyl acrylate | 50 g |
| Trimethylolpropane triacrylate | 15 g |
| Trimethylolpropanepropoxy triacrylate | 15 g |
| 2-Chlorothioxanthone | 1 g |
| N—Methyldiethanolamine | 0.1 g |
| Victoria blue | 0.05 g |
| Methyl ethyl ketone | 70 g |
| Tetrahydrofuran | 10 g |

This composition was coated onto a polyethylene glycol terephthalate film support having a thickness of 25 μm and dried at 75° C. to give a photosensitive film. A thickness of the photosensitive layer was 50 μm. The film was laminated onto a copper-clad laminate which had been polished, by means of rubber rollers heated at 100° C. A wire circuit pattern mask was put thereon and exposure was performed for 10 seconds from a distance of 50 cm using a super high pressure mercury lamp of 2 kw to harden. Thereafter development was performed with 1% sodium carbonate aqueous solution of 30° C. to give resin relief images on the copper-clad laminate.

Next, copper was etched with an alkali etchant to give a good printed wiring board.

Then, the system was immersed at 50° C. in 3% sodium hydroxide aqueous solution to strip the hardened layer. The hardened layer was stripped while the layer went into small pieces of approximately 2 to 5 mm square.

EXAMPLE 15

The following components were mixed to give a photosensitive polymerizable composition.

| | |
|---|---|
| Copolymer of 10 wt % of methacrylic | 50 g |

-continued

| | |
|---|---|
| acid, 10 wt % of acrylic acid, 50 wt % of methyl methacrylate and 30 wt % of 2-phenoxyethyl acrylate | |
| Trimethylolpropane triacrylate | 15 g |
| Glycerylpropoxy trimethacrylate | 15 g |
| Benzophenone | 1.5 g |
| Michler's ketone | 0.15 g |
| Victoria blue | 0.05 g |
| Methyl ethyl ketone | 70 g |
| Tetrahydrofuran | 10 g |

This composition was evaluated in a manner similar to Example 13. A good printed wiring board was obtained. The hardened layer was stripped while the layer went into small pieces of approximately w to 5 mm square.

COMPARATIVE EXAMPLE 1

The following components were mixed to give a photosensitive polymerizable composition.

| | |
|---|---|
| Copolymer of 20 wt % of acrylic acid and 80 wt % of methacrylic acid | 50 g |
| Nonaethylene glycol diacrylate | 20 g |
| 2-Chlorothioxanthone | 1 g |
| N—Methyldiethanolamine | 0.1 g |
| Victoria blue | 0.05 g |
| Methyl ethyl ketone | 70 g |
| Tetrahydrofuran | 10 g |

This composition was evaluated in a manner similar to Example 1. However, the hardened layer did not resist the alkali etchant but a good printed wiring board was not obtained.

COMPARATIVE EXAMPLE 2

The following components were mixed to give a photosensitive polymerizable composition.

| | |
|---|---|
| Copolymer of 12 wt % of methacrylic acid, 8 wt % of acrylic acid, 45 wt % of methyl methacrylate and 35 wt % of 2-phenoxyethyl acrylate | 50 g |
| Trimethylolpropane triacrylate | 30 g |
| 2-Chlorothioxanthone | 1 g |
| N—Methyldiethanolaine | 0.1 g |
| Victoria blue | 0.05 g |
| Methyl ethyl ketone | 70 g |
| Tetrahydrofuran | 10 g |

This composition was evaluated in a manner similar to Example 1. The hardened layer resisted the alkali etchant but scraped of by linear scratches of 1 mm intervals with a cutter knife.

What we claim is:

1. A photopolymerizable composition comprising:
(1) a thermoplastic high molecular weight binder obtained by copolymerizing:
  (i) 4 to 40 wt. % of an addition polymerizable monomer (A) containing the carboxyl group;
  (ii) at least 5 wt. % of an addition polymerizable non-acidic monomer (B) represented by the general formula:

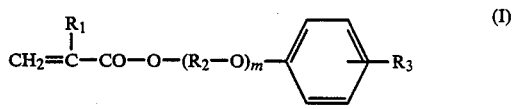

wherein $R_1$ is a hydrogen atom or methyl group; $R_2$ is an alkylene group having 1 to 5 carbon atoms: $R_3$ is a hydrogen atom, a halogen atom or an alkyl group having 1 to 5 carbon atoms; and m is an integer of 1 to 20; and
  (iii) at least an addition polymerizable non-acidic monomer satisfying the following formula:

$$0.25 < \frac{Q_A}{Q_B} \mathrm{Exp}\,[-e_A\,(e_A - e_C)] < 4.00 \qquad \text{(II)}$$

wherein Q and e are stability and polar values, respectively, as defined by the Alfrey-Price equation, and the symbols A and C correspond to the addition polymerizable monomer (A) and to the addition polymerizable non-acidic monomer (C), respectively;
(2) an acrylate or methacrylate ester derivative selected from the compounds of formulae (III), (IV) and (V):

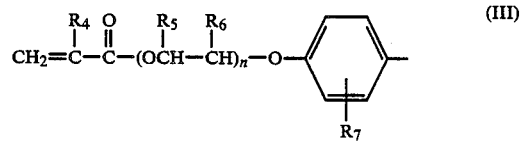

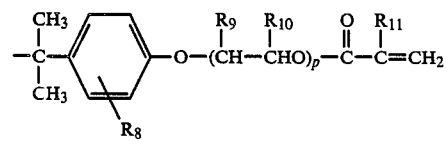

wherein $R_4$, $R_5$, $R_6$, $R_9$, $R_{10}$ and $R_{11}$ are the same or different and each is a hydrogen atom or methyl group; $R_7$ and $R_8$ are the same or different, and each is a hydrogen atom or a halogen atom; and n and p each is a positive integer satisfying n+p=2 to 20;
wherein $R_{12}$ and $R_{13}$ are the same or different and each is a hydrogen atom or methyl group; and q is an integer of 4 to 13;

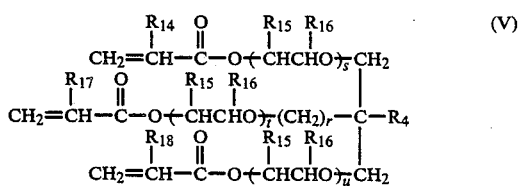

wherein $R_{14}$ is a hydrogen atom, an alkyl group having 1 to 6 carbon atoms, or an aryl group; $R_{15}$ and $R_{16}$ are each a hydrogen atom or a methyl group, provided that at least one is a methyl group; $R_{17}$ and $R_{18}$ are the same or different, and each is a hydrogen atom or a methyl group; r is 0, 1, 2 or 3; and s, t and w are each a positive integer satisfying $s+t+u=3$ to 30;

or a mixture of two or more of said acrylate or methacrylate ester derivatives; and (3) a photopolymerization initiator.

2. A composition of claim 1 which contains 100 parts by weight of the component (1), 10–200 parts by weight of the component (2) and 0.01–30 parts by weight of component (3).

3. A composition of claim 1 in which the addition polymerizable monomer having a carboxyl group (A) is methacrylic acid, or a mixture of methacrylic acid and acrylic acid; the addition polymerizable non-acidic monomer (B) is 2-phenoxyethyl acrylate (or methacrylate) and the addition polymerizable non-acidic monomer (C) is methyl acrylate or methacrylate.

4. A composition of claim 1 in which the acrylate (or methacrylate) derivative of the formula (III) is 2,2-bis 4-(acryloxydiethyoxy)phenyl propane.

5. A composition of claim 1 in which the acrylate (or methacrylate) derivative of the formula (IV) is nonaethylenediglycol diacrylate.

6. A composition of claim 1 in which the acrylate (or methacrylate) derivative of the formula (V) is glycerylpropoxy trimethacrylate or trimethylolpropanpropoxy triacrylate.

7. A composition of claim 1 wherein the component (2) is a mixture of two or more acrylate or methacrylate ester derivatives selected from the group consisting of compounds of formulae (III), (IV), and (V), and wherein at least two of said ester derivatives are selected from different of said formulae.

8. A composition of claim 7 in which at least one compound of each of the formulae (III) and (IV) is used in a mixture.

9. A composition of claim 7 in which the ratio of a compound of the formula (III), a compound of the formula (IV) and a compound of the formula (V) is 1:1–0.1:1–0.1 (parts by weight).

10. A composition of claim 7 in which the ratio of a compound of the formula (III) and a compound of the formula (IV) is 1:0.3–0.1 (parts by weight).

11. A composition of claim 2 in which the photopolymerization initiator is 2-chlorothioxanthone, 4,4'-bis(dimethylamino)benzophenone or 4,4'-bis(diethylamino)benzophenone.

* * * * *